(12) United States Patent
Ditewig et al.

(10) Patent No.: US 6,980,472 B2
(45) Date of Patent: Dec. 27, 2005

(54) DEVICE AND METHOD TO READ A 2-TRANSISTOR FLASH MEMORY CELL

(75) Inventors: Anthonie Meindert Herman Ditewig, Eindhoven (NL); Franciscus Petrus Widdershoven, Louvain (BE); Roger Cuppens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/498,449

(22) PCT Filed: Dec. 5, 2002

(86) PCT No.: PCT/IB02/05206

§ 371 (c)(1),
(2), (4) Date: Jun. 9, 2004

(87) PCT Pub. No.: WO03/050813

PCT Pub. Date: Jun. 19, 2003

(65) Prior Publication Data

US 2005/0018500 A1    Jan. 27, 2005

(30) Foreign Application Priority Data

Dec. 13, 2001 (EP) .................................. 01204846

(51) Int. Cl.$^7$ ............................................. G11C 16/04
(52) U.S. Cl. ............. 365/185.18; 365/202; 365/185.23
(58) Field of Search ........................... 365/185.18, 202, 365/185.23, 185.26, 185.27, 185.28

(56) References Cited

U.S. PATENT DOCUMENTS

| | | | | |
|---|---|---|---|---|
| 5,471,422 A | * | 11/1995 | Chang et al. ........... | 365/185.26 |
| 5,914,514 A | * | 6/1999 | Dejenfelt et al. ............ | 257/322 |
| 6,212,102 B1 | * | 4/2001 | Georgakos et al. .... | 365/185.18 |
| 6,307,781 B1 | * | 10/2001 | Shum ..................... | 365/185.17 |
| 6,757,196 B1 | * | 6/2004 | Tsao et al. ............. | 365/185.17 |

* cited by examiner

*Primary Examiner*—Anh Phung
*Assistant Examiner*—Dang T. Nguyen
(74) *Attorney, Agent, or Firm*—Peter Zawilski

(57) ABSTRACT

The present invention relates to electronic memories, more particularly to an improved method and apparatus to read the content of compact 2-transistor flash memory cells.

A method of reading a 2-transistor flash memory cell 1 is provided. The memory cell 1 comprises a storage transistor 2 with a storage gate 6 and a selecting transistor 3 with a select gate 7. The method comprises leaving the storage gate 6 floating while the select gate 7 is switched from a first voltage to a second voltage, whereby the first voltage is lower than the second voltage.

A device according to the present invention comprises a switching circuit for leaving the storage gate 6 floating while the select gate 7 is switched from the first voltage to the second voltage, the first voltage being lower than the second voltage.

13 Claims, 4 Drawing Sheets

DEVICE AND METHOD TO READ A 2-TRANSISTOR FLASH MEMORY CELL

The present invention relates to electronic memories, more particularly to compact 2-transistor flash memory or EEPROM cells, and more specifically to an improved method and apparatus to read the content of such cells.

Electronic memory exists in a variety of forms, to serve a variety of purposes. Flash memory is used for easy and fast information storage in such devices as e.g. digital cameras, home video game consoles and for data and program code storage in devices such as e.g. smart cards, micro-controllers and mobile phones.

Flash memory is a type of Electrically Erasable and Programmable Read Only Memory (EEPROM or E$^2$PROM), e.g. in the form of a chip. It has a grid of columns and rows with at each intersection of a column and a row a cell that has two gates, separated from each other by a thin oxide layer. One of the gates is known as a floating gate and the other one is known as the control gate. Flash memory is a non-volatile memory, which allows a user to electrically program and erase information.

A schematic representation of a 2-transistor (2T) flash memory cell is given in FIG. 1. A 2T flash memory cell 1 comprises a storage transistor 2 for storing data, with a first and a second terminal and a storage gate 6, and a selecting transistor 3 for selecting the memory cell 1 in an array of memory cells, with a first and a second terminal and a select gate 7. The storage transistor 2 comprises a floating gate 4 and a control gate 5, the control gate 5 being connected to the storage gate 6 of the storage transistor 2. As can be seen from FIG. 1, a usually undesired capacitor 8 is present between the storage gate 6 and the select gate 7. With decreasing process geometries (presently going down to 0.12 μm processes) and further compaction of the 2T cell, such a capacitor 8 becomes that large, that it negatively influences design performance when a memory cell 1 is read out with a traditional read-out method.

A schematic cross-section of such a memory cell 1 is shown in FIG. 2, and typically includes a source 9 of a first conductivity type, a drain 10 of a first conductivity type and a channel 11 in a substrate 12 of a second conductivity type having a top surface 13. The two transistors, the storage transistor 2 and the selecting transistor 3, are overlying the channel 11. The first and the second conductivity types can be n-type and p-type respectively, or vice versa.

The storage transistor 2 comprises a stacked gate structure 14. The stacked gate structure 14 includes a thin gate dielectric layer 15 (commonly referred to as a tunnel oxide layer) formed on a part of the top surface 13 of the substrate 12. The tunnel oxide layer 15 coats a portion of the top surface 13 of the silicon substrate 12 and serves to support an array of different layers directly over the channel 11. The stacked gate structure 14 includes a lowermost or first layer 16, such as doped polycrystalline silicon (polysilicon or poly I) layer which serves as a floating gate 4 that overlies the tunnel oxide layer 15. On top of the poly I layer 16 is an interpoly dielectric layer 17. The interpoly dielectric layer is 17 often a multilayer insulator such as an oxide-nitride-oxide (ONO) layer having two oxide layers sandwiching a nitride layer, or in an alternative can be another dielectric layer such as e.g. tantalum pentoxide. Finally, the stacked gate structure 14 includes an upper or second polysilicon layer 18 (poly II) which serves as a polysilicon control gate 5 overlying the interpoly dielectric layer 17. The selecting transistor 3 comprises a select gate oxide 19 formed on a part of the top surface 13 of the substrate 12 above the channel region 11. On top of this select gate oxide 19, a polysilicon layer 20 (poly III) is applied, which serves as select gate 7.

According to conventional operation, the 2T flash memory cell 1 is programmed and erased by Fowler-Nordheim (FN) tunnelling. However, it is also possible to program this cell by hot-electron programming (source side injection) and erase it by FN tunnelling. The following conditions may for example apply (these are examples only, other combinations are also possible):

Program by FN:
V_storage gate at 16V, the rest at 0V
Erase by FN:
V_storage gate at −16V, the rest at 0V
Program by source side injection:
V_storage gate 7V
V_select gate 1V
V_drain 4V
V_source 0V If a memory cell 1 (e.g. made in a 0.18 μm technology) is to be selected for programming by FN tunnelling, a voltage $V_C$ of approximately 16 Volt is applied to the control gate 5 of the storage transistor 2. The source 9, the select gate 7 and the drain 10 are kept at a low voltage (e.g. 0 Volt). The electrons tunnel across the tunnel oxide layer 15 and into the floating gate 4. This floating gate 4 is surrounded by insulators (the interpoly dielectric layer 17, the tunnel oxide layer 15 and the isolation dielectric 26) so that after a programming step these electrons will remain in the floating gate 4. This results in an increase of the threshold voltage $V_T$ of the storage transistor 2 of the memory cell 1 by about 3 Volt. In the 0.18 μm technology the threshold voltage of the storage transistor is typically increased to a value of 2.5 Volt. This change in threshold voltage $V_T$ (and thereby in channel conductance) of the memory cell 1 created by the trapped electrons is what causes the memory cell 1 to be programmed.

If a memory cell 1 (e.g. made in a 0.18 μm technology) is to be selected for programming by hot electrons (source side injection), a voltage $V_C$ of approximately 7 Volt is applied to the control gate 5 of the storage transistor 2. The select gate 7 of selecting transistor 3 has to be biased with a voltage of about 1 Volt, the drain 10 with about 4 Volt, while the source 9 is kept at a low voltage (e.g. 0 Volts). These conditions produce high-energy electrons ("hot" electrons) at that side of the storage transistor 2 located near the selecting transistor 3. These hot electrons are attracted towards the floating gate 4 and will contribute to an increase of the threshold voltage of the storage transistor 2.

In order to erase the memory cell 1, a voltage $V_C$ of approximately −16 Volt is applied to the control gate 5 of the storage transistor 2. The source 9, the select gate 7 and the drain 10 are kept at a low voltage (e.g. 0 Volts). Electrons tunnel across the tunnel oxide layer 15 and from the floating gate 4 to the substrate interface 13. They are extracted from the floating gate 4 by Fowler-Nordheim tunneling through the tunnel oxide 15. After an erase step, the threshold voltage of the storage transistor 2 will be decreased and can even become negative. In the 0.18 μm technology, the threshold voltage of the storage transistor 2 is typically decreased to a value of −0.5 Volt.

To read the memory cell 1, a voltage $V_{SE}$, conventionally equal to the supply voltage, but in any case higher than the threshold voltage of the selecting transistor 3 (e.g. approximately 0.6 Volt) is applied to the select gate 7 of that memory cell 1. A predetermined voltage $V_C$ that is greater than the highest allowed threshold voltage of the storage transistor 2 in an erased memory cell 1, but less than the lowest allowed threshold voltage of the storage transistor 2 in a programmed memory cell 1, is applied to the control gate 5 of the storage transistor 2. In the 0.18 μm technology $V_C$ was chosen to be about 1.1 Volt. The source 9 of the memory cell 1 is kept at a low voltage (e.g. 0 Volt), while a small voltage (about 0.4 Volt) is applied to the drain 10 of the memory cell 1. The latter one is needed to allow the verification if the memory cell 1 conducts a current. If the memory cell 1 conducts, then it has been erased and is not programmed (the memory cell 1 is therefore at a first logic state, e.g. a one "1"). Conversely, if the memory cell 1 does not conduct, then it has been programmed (the memory cell 1 is therefore at a second logic state, e.g. a zero "0"). Thus, each memory cell 1 may be read in order to determine whether it has been programmed (and therefore identify the logic state of the memory cell 1).

If memory cells 1 are connected into an array of memory cells, when a read cycle is started for reading out the content of the memory cells, the storage gates 6 of all memory cells 1 are connected to an appropriate voltage (larger than the threshold voltage of an erased memory cell 1, but less than the threshold voltage of a programmed memory cell 1). The disadvantage is that a fast ramp-up of the select gate 7, due to the capacitive coupling (capacitor 8) between the select gate 7 and the control gate 5, gives an overshoot on the voltage applied to the storage gate 6. This may make a memory cell 1 conduct, although it has been programmed, which results in an erroneous read-out of the memory cell 1. This is a reliability concern, which can be prevented by a slow ramp-up of the select gate 7, but this gives unacceptable delay of the memory-read access time.

It is an object of the present invention to provide an improved method and apparatus to read out a 2T memory cell.

The above objective is accomplished by a fast read method according to the present invention, in which use is made of a capacitive coupling between the select gate of a selecting transistor and the storage gate of a storage transistor of a 2T flash memory cell.

A method of reading a 2-transistor flash memory cell according to the present invention comprises leaving the storage gate floating while the select gate is switched from a first voltage to a second voltage, the first voltage being lower than the second voltage.

The method may comprise the steps of:
pre-charging the storage gate,
after the pre-charging step making the storage gate floating,
after the floating step applying a voltage above the threshold voltage of the selecting transistor to the select gate,
reading out the flash memory cell.

Use may be made of a capacitive coupling between the storage gate and the select gate in order to apply to the storage gate a voltage larger than the threshold voltage of an unprogrammed or erased memory cell, but smaller than the threshold voltage of a programmed memory cell. By the term "unprogrammed" is meant that the memory cell is not in a state in which it contains or "stores" a representation of a bit, e.g. it is in the erased state. Similarly, the term "programmed" means that it is in a state in which it contains or stores a representation of a bit. In a binary system, the stored bit may be a "0" or a "1"—this is a matter of convention only.

The present invention also provides a method for reading out an array of 2T flash memory cells. Each 2T flash memory cell comprises a storage transistor with a storage gate and a selecting transistor with a select gate. The method comprises the steps of
applying a voltage to the storage gates of the memory cells in a row when this row is not selected,
thereafter selecting a row of memory cells by making the storage gates floating, and
switching the select gates of said selected memory cells while the storage gates of the selected memory cells are floating.

A method according to the present invention may furthermore comprise the steps of
selecting a column of memory cells, and
reading out the memory cell on the selected row in the selected column.

Here again, use may be made of a capacitive coupling between the storage gate and the select gate of a memory cell in order to apply to the storage gate a voltage larger than the threshold voltage of an unprogrammed or erased memory cell but smaller than the threshold voltage of a programmed memory cell.

The above object is also provided by a memory device according to the present invention. Such a memory device comprises at least one 2-transistor flash memory cell having a storage transistor with a storage gate and a selecting transistor with a select gate, and a switching circuit for leaving the storage gate floating while the select gate is switched from a first voltage to a second voltage, the first voltage being lower than the second voltage.

According to an embodiment of the present invention, the switching circuit is adapted to
pre-charge the storage gate,
after pre-charging make the storage gate floating, and
after floating applying a voltage above the threshold voltage of the selecting transistor to the select gate.

A voltage larger than the threshold voltage of an unprogrammed or erased memory cell, but smaller than the threshold voltage of a programmed memory cell may be applied by capacitive coupling to the storage gate after the voltage to the select gate is switched.

The present invention also provides a memory device comprising an array of 2T flash memory cells, wherein each 2T flash memory cell has a storage transistor with a storage gate and a selecting transistor with a select gate. The memory device further comprises means for selecting a memory cell by applying a voltage to the select gate of the selecting transistor, and means for leaving the storage gate of the selected memory cell floating while the select gate of said selected memory cell is switched.

Such a memory device may furthermore comprise means for pre-charging the storage gate, means for making the storage gate floating after the pre-charging, and means for applying a first voltage above the threshold voltage of the selecting transistor to the select gate after the storage gate is floating, such that a second voltage larger than the threshold voltage of an unprogrammed or erased memory cell, but smaller than the threshold voltage of a programmed memory cell is applied by capacitive coupling to the storage gate after the first voltage is applied to the select gate.

The memory device may furthermore comprise means for selecting a column of memory cells, and means for reading out the memory cell on the selected row and in the selected column.

These and other features and advantages of the present invention will become apparent from the following detailed description, taken in conjunction with the accompanying drawings, which illustrate, by way of example, the principles of the invention.

Figure 1:
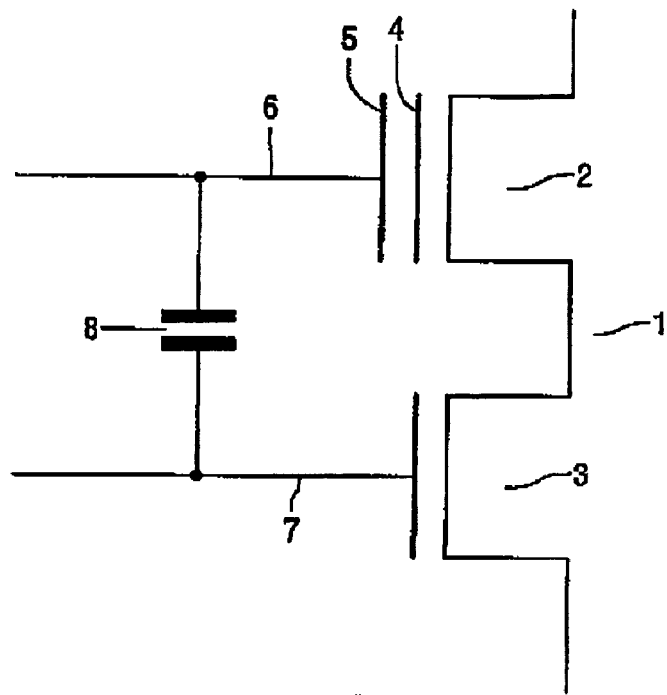
FIG. 1 is a schematic representation of a 2T flash memory cell.

In the different drawings, the same reference figures refer to the same or analogous elements.

The present invention will be described with respect to particular embodiments and with reference to certain drawings but the invention is not limited thereto but only by the claims. The drawings described are only schematic and are non-limiting.

A read-out method and apparatus according to the present invention applies a same voltage (pre-charge) to all storage gates 6 of the memory cells 1 in an array of memory cells 1 to a voltage below the wanted voltage during a read operation. The pre-charge voltage to be used depends on the manufacturing technology of the 2T memory cell. When a read cycle is started, the storage gates 6 of all cells in the selected wordline are made floating. Thereafter, the corresponding selecting transistors 3 are switched on by applying an appropriate voltage to the select gates 7 of the memory cells 1 in the selected wordline. The capacitive coupling 8 between the select gate 7 and the storage gate 6 of each memory cell 1 in the selected wordline increases the storage gate voltage level of these memory cells to the level needed for appropriate reading of some cells in the selected wordline. These cells are selected via column selecting transistors. The voltages are applied by a switching circuit whose construction can be implemented in different ways by a skilled person on understanding the present invention. The same switching circuits can be used to bring the storage gates of the selected cells to either a high positive voltage or to a high negative voltage during a program or erase cycle.

Figure 3:
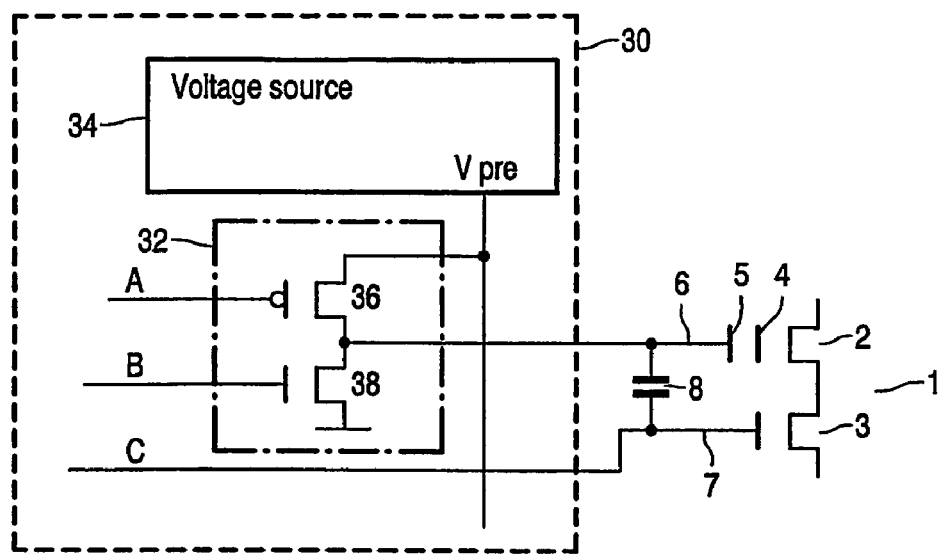
FIG. 3 is a schematic representation of a 2T flash memory cell provided with a first embodiment of a switching circuit according to the present invention.

One embodiment of such a switching circuit 30 is shown in FIG. 3 and comprises a storage gate driver 32 and a voltage reference source 34, which is setting the pre-determined pre-charge voltage $V_{pre}$ to the storage gate 6 before the read cycle is started. MOS processing technology may be used. The storage gate driver 32 comprises a pMOS transistor 36 and an nMOS transistor 38 each having a source, a drain and a gate, and being connected so that the drain of the nMOS transistor 36 is connected to the drain of the pMOS transistor 38, the source of the nMOS transistor 38 being connected to the ground and the source of the pMOS transistor 36 being connected to the voltage reference source 34. In order to set the pre-charge voltage $V_{pre}$ to the storage gates 6 of the storage transistor 2, the gate of the nMOS transistor 38 is connected to 0 Volts and the gate of the pMOS transistor 36 is connected as well to 0 Volt. The pre-charge voltage $V_{pre}$ to be applied is depending on the technology of the transistors used. For example for a 0.18 μm technology, the pre-charge voltage to be used is about 0.6 Volts. Theoretically, for some technologies, the pre-charge voltage $V_{pre}$ can be 0 Volts.

When a read cycle is performed, the storage gate driver 32 of the storage gate 6 switches off so that the storage gate 6 of the storage transistor 2 is made floating. This is done by bringing signal A on the gate of the pMOS transistor 36 in the driver 32 to Vdd, while signal B on the gate of the nMOS transistor 38 remains 0. Subsequently, the gate 7 of the selecting transistor 3 is switched on by bringing signal C to Vdd, so that a read cycle can be performed.

Because of switching the select gate 7 from a low to a high voltage, because the storage gate 6 is capacitively coupled to the select gate 7, and because the storage gate 6 is floating, a voltage will be present at the storage gate which turns the storage transistor on only if it is erased or thus in the low threshold state.

Figure 4:
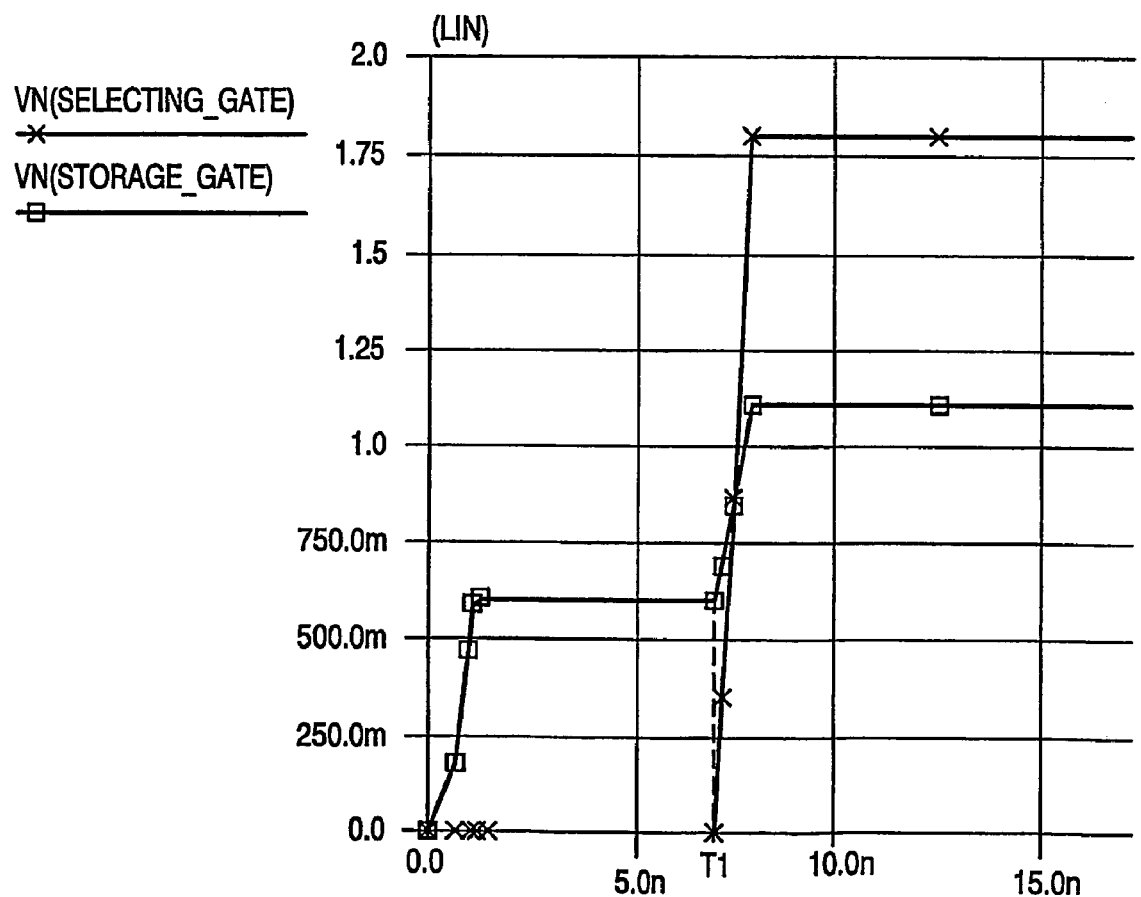
FIG. 4 is a graph representing simulation results of voltages at the select gate and storage gate of a 2T flash memory cell in function of time.

A simulation result for a 0.18 μm technology memory cell 1 is shown in FIG. 4. First the storage gate is pre-charged to 0.6 Volts by means of a switching circuit, while the select gate 7 is kept at 0 Volts. At a time T1, the storage gate 6 is made floating, and subsequently the select gate 7 is switched on to 1.8 Volt. The threshold voltage of a selecting transistor in 0.18 μm technology is around 0.6 Volt. Due to the capacitive coupling between the storage gate 6 and the select gate 7, the voltage on the floating storage gate 6 increases to about 1.1 Volt. In 0.18 μm technnology, the threshold voltage for a storage transistor in programmed state is between 1.5 and 3.5 Volt (depending on the programming time and the spread in processing), and the threshold voltage for a storage transistor in an unprogrammed or erased cell is typically slightly negative, but is allowed to be between −0.5 and −1.5 Volt. By the term "unprogrammed" is meant that the memory cell is not in a state in which it contains or "stores" a representation of a bit, e.g. it is in the erased state. Similarly, the term "programmed" means that it is in a state in which it contains or stores a representation of a bit. In a binary system, the stored bit may be a "0" or a "1"—this is a matter of convention only.

As the storage gate 6 was floating before the select gate 7 is switched on, the voltage on the storage gate 6 goes to a higher level and stays there. No voltage (or charge) is leaking away, as is the case in the conventional method where the storage gate is connected to a fixed voltage when switching on the select gate. Now the device can be read out by detecting or determining whether or not the memory cell 1 conducts.

After the read operation has taken place, the select gate 7 is switched off and subsequently the storage gate 6 is connected to the appropriate voltage again.

Therefore, in the above method, the capacitive coupling due to capacitance 8 between the storage gate 6 and the select gate 7 is not seen as a disadvantage or problem, but rather as something useful.

It is to be noted that the sheet resistance of the storage gate is high, for example around 450 Ω/square (the sheet resistance is a parameter defined by the resistance of a square sheet of a layer of material), as the gate 6 of the storage transistor 2 comprises polysilicon which has a certain resistance. An isolating cap layer 21 is located on the storage transistor's control gate 18. This cap layer 21 is needed to avoid short-circuiting (so-called "bridging") between the control gate 18 and the select gate 20 during silicide formation by preventing the formation of silicide on top of the control gate 18. A silicide layer 22 is applied for obtaining a low resistive gate connection. Therefore, the resistance of the control gate 18 will be considerably higher than that of the select gate 20. Under conventional read-out operation, this high resistance, in combination with the strong capacitive coupling 25 between the select gate 20 and the control gate 18, causes considerable cross-talk from the select gate 20 to the control gate 18. However, if operated according to the novel read-out method of the present invention, the high capacitive coupling 25 is used as the capacitor 8 indicated in FIG. 1. In this way, the capacitive coupling is changed from an unwanted parasitic component into a useful component of a compact 2T flash memory cell.

In a further embodiment, a plurality of memory cells can be applied in a memory, wherein the memory cells are arranged in a plurality of rows and a plurality of columns.

Figure 5:
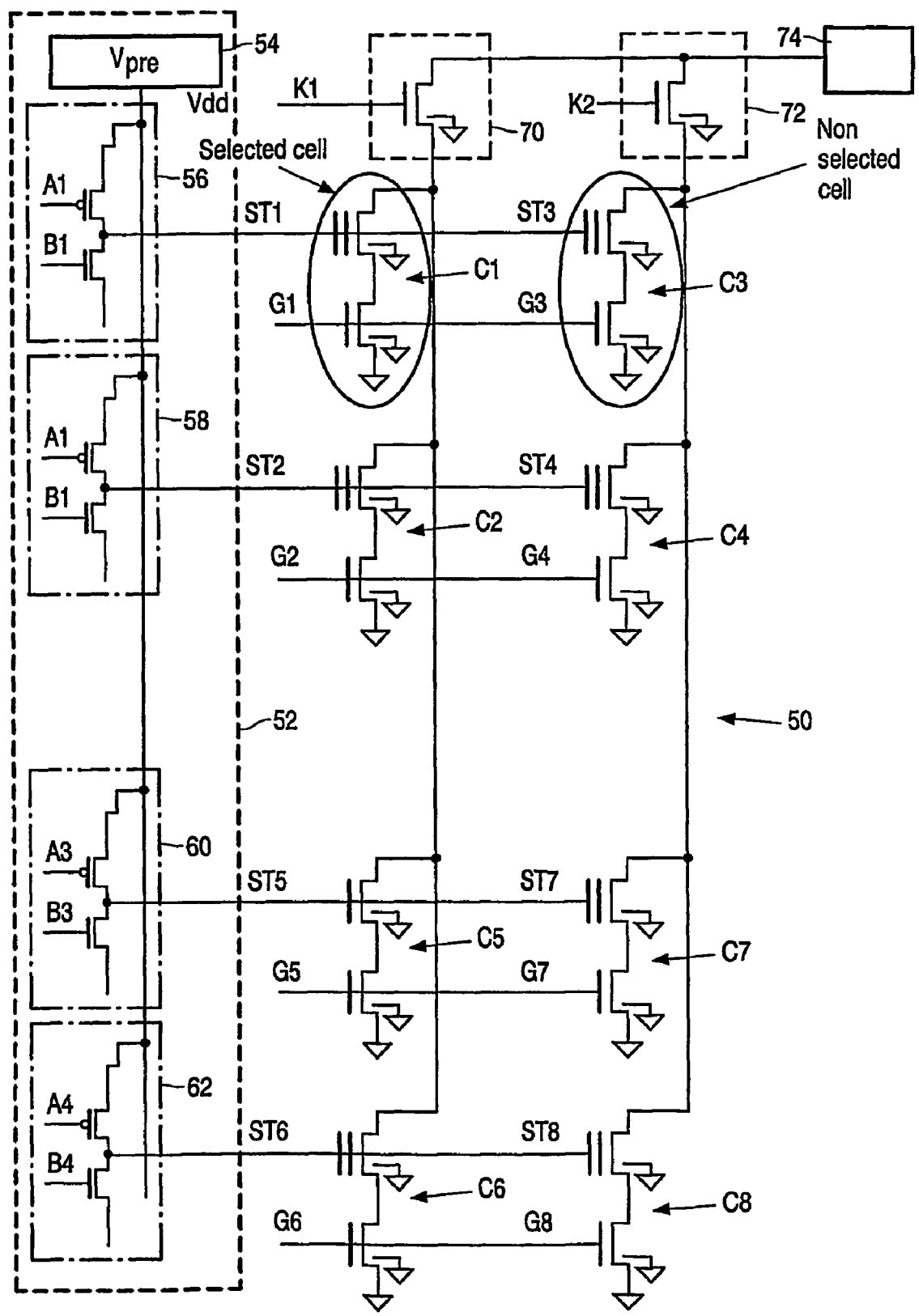
FIG. 5 is a schematic representation of an array of 2T flash memory cells provided with a switching circuit.

FIG. 5 shows a memory cell array 50 in which a plurality of memory cells C1–C8 are arranged in a matrix comprising rows and columns. Each column of memory cells can be selected by a column selecting transistor 70, 72, connecting the selected column to the input of a sense amplifier 74. Each row of memory cells can be selected by a storage gate driver 56, 58, 60, 62. A particular memory cell C1 is only selected if both its column selecting transistor and its storage gate driver are switched on.

In order to read out the memory cell array 50 using the method according to the present invention, the memory cell array 50 is connected to a suitable switching circuit 52 comprising a voltage reference source 54 and the storage gate drivers 56, 58, 60, 62. The switching circuit 52 given in FIG. 5 is the same as the one given in FIG. 3, but a person skilled in the art could provide other embodiments of switching circuits.

Figure 6:
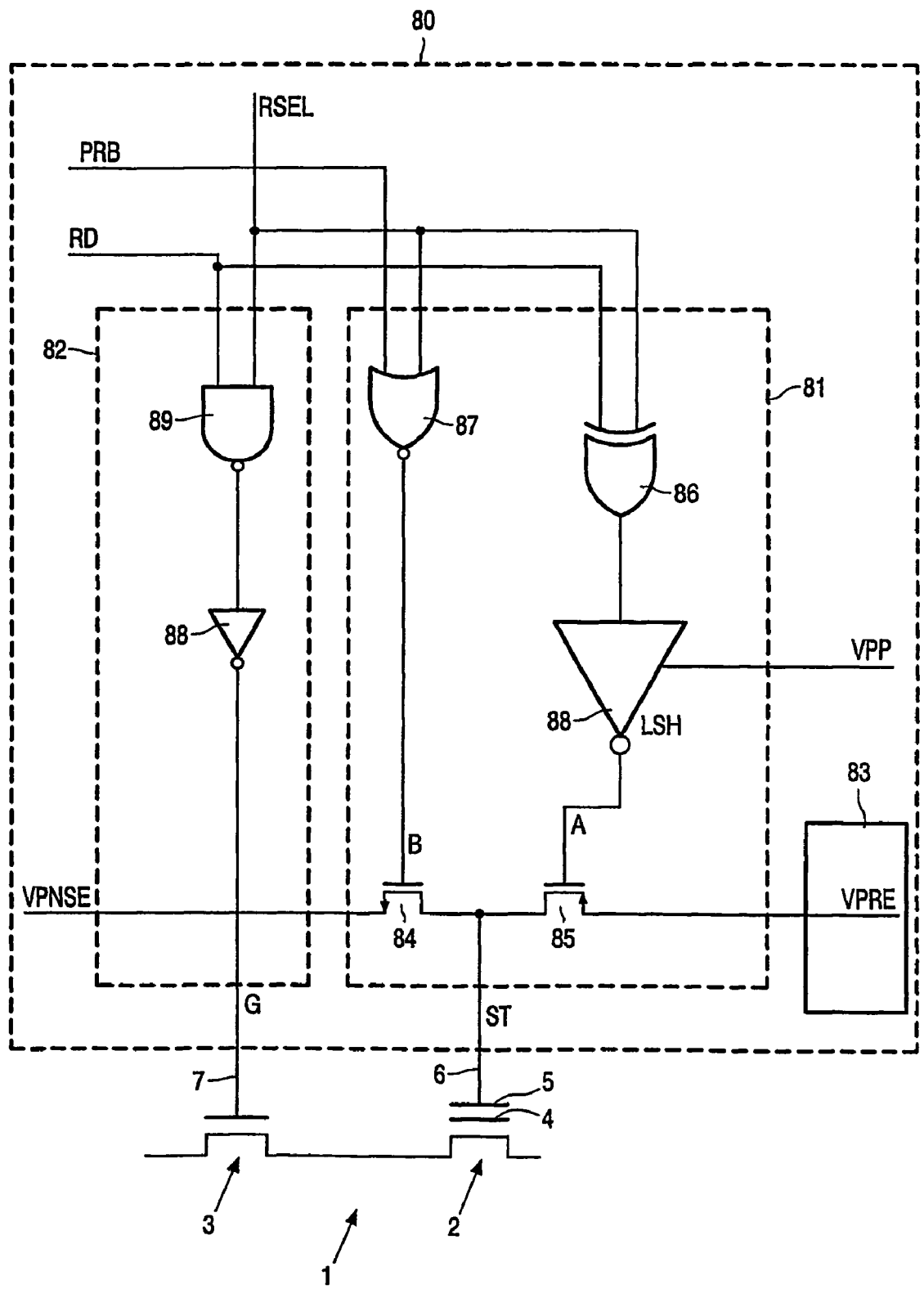
FIG. 6 is a schematic representation of a 2T flash memory cell provided with a second embodiment of a switching circuit.

Another embodiment of a switching circuit or wordline driver circuit 80 is shown schematically in FIG. 6. It comprises a storage gate driver 81, a select gate driver 82 and a voltage reference source 83, which is setting the predetermined pre-charge voltage Vpre to the storage gate 6 before a read cycle is started. The wordline driver circuit 80 generates the switching conditions according to the present invention and is also able to force a selected storage gate 6 to either the high program voltage or the negative erase voltage.

The storage gate driver 81 comprises an nMOS transistor 84 and a pMOS transistor 85 as in FIG. 3, each having a source, a drain and a gate, and being coupled with their drains together. The source of the nMOS transistor 84 is connected to a voltage VPNSE, which normally is at 0 Volt. Only during erase, this signal will selectively (only for the selected cells) be discharged to the high negative erase voltage. The source of the pMOS transistor 85 is coupled to the reference voltage supply 83 that during a programming step will be charged to a high positive voltage $V_{pre}$.

A signal ST is obtained at the drains of the nMOS transistor 84 and the pMOS transistor 85, and this signal is the storage gate signal for a row of memory cells. To be able to charge the storage gate 6 selectively to the program voltage (only for a selected cell), the signal A to the gate of the pMOS transistor 85 also has to be able to be charged to this voltage. This is done via an inverting level shifter LSH which has a supply voltage $V_{PP}$ that mostly is at $V_{DD}$; only during programming, this supply voltage $V_{PP}$ is charged to the high program voltage. The input signal of this level shifter LSH is an XOR-ed combination (exclusive OR) of a first signal RSEL and a second signal RD. RD is a global read signal that is normally at $V_{DD}$; only during a program or erase cycle it will be at 0 Volt. RSEL is coming from a row decoder and will be at $V_{DD}$ when the row is to be selected. Only if both inputs to the XOR gate 86 are different, its output signal is high.

All other signals in the wordline driver circuit 80 are normal logic signals operating from the normal supply voltage $V_{DD}$. A third signal PRB is also a global signal that normally will be at $V_{DD}$, only during a program cycle it will be forced to 0 Volt. The first signal RSEL and the third signal PRB are input signals of a NOR gate 87, the output signal Z2 of which is high only if both input signals are low. This output signal Z2 is fed to the gate of the nMOS transistor 84.

A signal G supplied by the select gate driver 82 of the wordline driver circuit 80 is the select gate signal for a row of memory cells. This signal G is the output signal of an inverter element 88, which has as input signal the output signal of a NAND gate 89. This NAND gate 89 has as input signals the first signal RSEL and the second signal RD. Only if both input signals are high, the output signal of the NAND gate 89 is low.

In the read mode (the second signal RD and the third signal PRB are "1" or thus high) when the row is not selected (RSEL is "0" or thus low), the select gate 7 of the memory cell 1 gets a zero signal. The signals at the gates of the nMOS transistor 84 an pMOS transistor 85 are at "0" and the storage gate 6 is pre-charged to $V_{pre}$. When the row is selected (the signal RSEL goes to a "1"), the signal A at the gate of pMOS transistor 85 will go to $V_{DD}$, while the signal B at the gate of the nMOS transistor 84 stays at "0", making the storage gate 6 floating. Also the signal G at the select gate 7 will switch to $V_{DD}$. But since the capacitive loading of G (a complete wordline) is much higher than that of node A, A will be charged much faster so that while select gate 7 is switching to VDD, the storage gate 6 will already be floating.

The above operation fully complies with the operation of the switching circuit illustrated in FIG. 3.

Returning now to the embodiment of FIG. 5, before the read cycle is started, a same voltage is applied to the storage gates ST1–ST8 of all memory cells C1–C8 in the array 50 by means of the voltage reference source 54. In order to obtain this, all signals A1–A4 applied to the gates of the pMOS transistors of the storage gate drivers 56, 58, 60, 62 are set to 0 Volt (none of the rows selected), while in the read mode the signals B1–B4 applied to the gates of the nMOS transistors of the storage gate drivers 56, 58, 60, 62 are continuously kept to 0 Volt. At the same time, the gates of the selecting transistors G1–G8 of the non-selected rows are also at 0 Volt. The gate K1, K2 of a column selecting transistor 70, 72 of a non-selected column is also connected at 0 Volt.

When the read cycle is started, and e.g. memory cell C1 is going to be read out, the column selecting transistor 70 will be switched on by setting the selection line K1 to the supply voltage level. The selected bitline, a line connecting all the drains of the memory cells in a same column, is connected to the input of a sense amlifier 74, that will force a small voltage (about 0.5 Volt) to the drains of the memory cells in the selected column, and that will be able to detect if one cell in the column sinks a current. Further the storage gates ST1, ST3 of the cells in the selected wordline are made floating by bringing signal A1 on the gate of the pMOS transistor of the storage gate driver 56 to $V_{dd}$, while signal B1 on the gate of the nMOS transistor remains 0. Subsequently, the gates G1, G3 of the selecting transistor in the memory cells C1, C3 within the selected wordline are switched on by bringing the signal on the line coupling these gates G1, G3 from a lower (0 Volt) to a higher voltage level, e.g. to $V_{dd}$. Due to the capacitive coupling between the select gate and the storage gate ST1 in the memory cells C1, C3 of this selected wordline, combined with the switching of the voltage on the select gates G1, G3, a voltage will appear on the storage gates ST1, ST3 in the selected wordline, which turns the storage transistor of the memory cells C1, C3 on only if they were erased. Only memory cell C1 is connected via selecting transistor 70 to the sense amplifier 74 and will thus be read out. If memory cell C1 conducts, it is unprogrammed or erased, and if it does not conduct, it is programmed. Therefore, its logic state can be read out.

After the read operation has taken place, the select transistor of memory cells C1, C3 in the selected wordline are switched off by bringing the signal on select gates G1, G3 down again, lower than the threshold voltage of said select transistor. Subsequently, the storage gates ST1, ST3 are connected to the pre-charge voltage $V_{pre}$ again by switching the signals A1 back to 0 Volt and keeping B1 at 0 Volt. This preset operation will take place when the wordline (row of memory cells) is deselected and another row is selected.

In the description hereinabove, test or simulation results are only given for a 0.18 μm technology. Oxide thicknesses and program and erase voltages do not tend to scale when going to next generation processes, therefore all effects and solutions discussed here will almost be the same.

The transition from an actual two transistor flash cell to the compact 2T cell described above causes a large increase in the capacitive coupling between the select gate and the storage gate, which makes the above solution useful. With the conventional 2T memory cell, the relative importance of the coupling capacitor between the select gate and the control gate will increase when going to next generation processes due to a smaller spacing between the two gates. Therefore the solution discussed is also useful for a conventional 2T memory cell, from a certain process generation on, e.g. from a 0.12 μm process.

Figure 2:
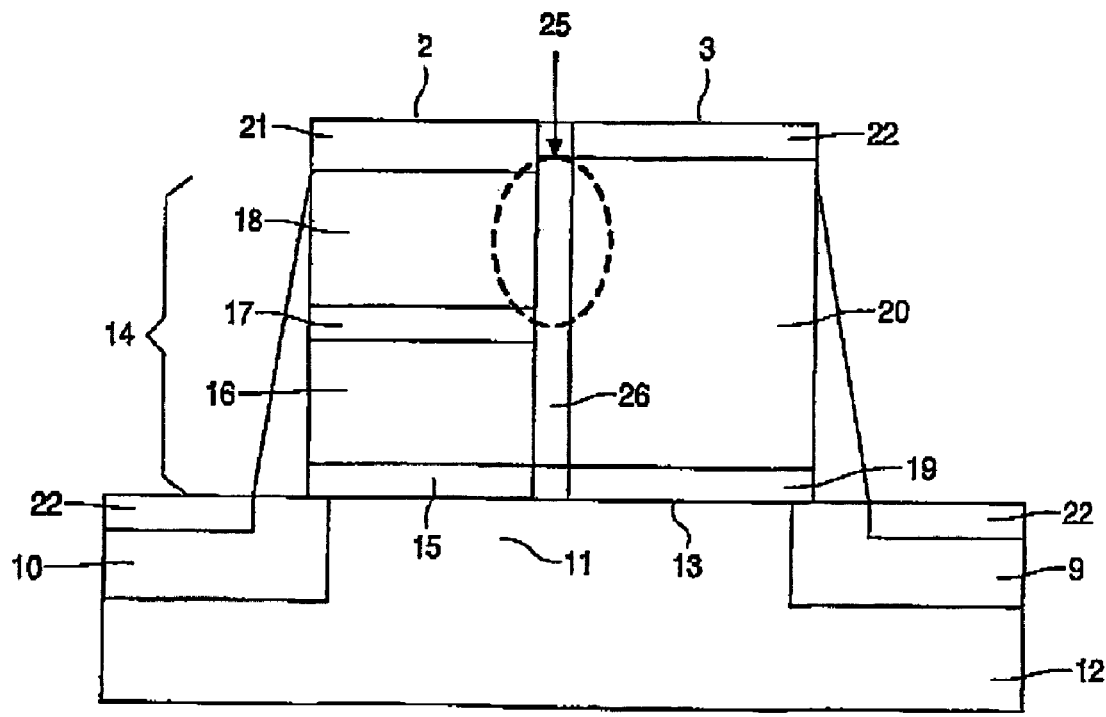
FIG. 2 is an enlarged cross-section of a compact 2T flash memory cell.

In the drawings, especially in FIG. 2, the size of the different layers has been exaggerated for illustrative purposes.

While the invention has been shown and described with reference to preferred embodiments, it will be understood by those skilled in the art that various changes or modifications in form and detail may be made without departing from the scope and spirit of this invention.

What is claimed is:

1. A method of reading out a 2-transistor flash memory cell, comprising a storage transistor with a storage gate and a selecting transistor with a select gate, the method comprising leaving the storage gate floating while the select gate is switched from a first voltage to a second voltage, the first voltage being lower than the second voltage.

2. A method according to claim 1, comprising the steps of
    pre-charging the storage gate,
    after the pre-charging step making the storage gate floating,
    after the floating step applying a voltage above the threshold voltage of the selecting transistor to the select gate, and
    reading out the flash memory cell.

3. A method according to claim 1, comprising a step of making use of a capacitive coupling between the storage gate and the select gate in order to apply to the storage gate a voltage larger than the threshold voltage of an unprogrammed memory cell but smaller than the threshold voltage of a programmed memory cell.

4. A method for reading out an array of 2T flash memory cells, each 2T flash memory cell comprising a storage transistor with a storage gate and a selecting transistor with a select gate, the method comprising the steps of
    applying a voltage to the storage gates of the memory cells in a row when this row is not selected,
    thereafter selecting a row of memory cells by making the storage gates floating, and
    switching the select gates of said selected memory cells while the storage gates of the selected memory cells are floating.

5. A method according to claim 4, furthermore comprising the steps of:
    selecting a column of memory cells, and
    reading out the memory cell on the selected row in the selected column.

6. A method according to claim 4, comprising a step of making use of a capacitive coupling between the storage gate and the select gate in order to apply to the storage gate a voltage larger than the threshold voltage of an unprogrammed memory cell but smaller than the threshold voltage of a programmed memory cell.

7. A memory device comprising: at least one 2-transistor flash memory cell having a storage transistor with a storage gate and a selecting transistor with a select gate, and a switching circuit for leaving the storage gate floating while the select gate is switched from a first voltage to a second voltage, the first voltage being lower than the second voltage.

8. A memory device according to claim 7, wherein the switching circuit is adapted to
    pre-charge the storage gate,
    after pre-charging make the storage gate floating, and
    after floating applying a voltage above the threshold voltage of the selecting transistor to the select gate.

9. A memory device according to claim 7, wherein a voltage larger than the threshold voltage of an unprogrammed memory cell, but smaller than the threshold voltage of a programmed memory cell is applied by capacitive coupling to the storage gate after the voltage to the select gate is switched.

10. A memory device comprising: an array of 2T flash memory cells, each 2T flash memory cell (1) having a storage transistor (2) with a storage gate (6) and a selecting transistor (3) with a select gate (7), the memory device further comprising:
    means for applying a voltage to the storage gates of the memory cells in a row when this row is not selected,
    means for selecting a row of memory cells by making the storage gates (6) floating, and
    means for switching the select gates (7) of the selected row of memory cells while the storage gates of the selected memory cells are floating.

11. A memory device according to claim 10, furthermore comprising:
    means for pre-charging the storage gate,
    means for making the storage gate floating after the pre-charging, and
    means for applying a first voltage above the threshold voltage of the selecting transistor to the select gate after the storage gate is floating, such that a second voltage larger than the threshold voltage of an unprogrammed memory cell, but smaller than the threshold voltage of a programmed memory cell is applied by capacitive coupling to the storage gate after the first voltage is applied to the select gate.

12. A memory device according to claim 10, furthermore comprising
    means for selecting a column of memory cells, and
    means for reading out the memory cell on the selected row and in the selected column.

13. A memory device according to claim 11, furthermore comprising
    means for selecting a column of memory cells, and
    means for reading out the memory cell on the selected row and in the selected column.

* * * * *